(12) United States Patent
Jang

(10) Patent No.: US 9,401,405 B2
(45) Date of Patent: Jul. 26, 2016

(54) SEMICONDUCTOR DEVICE AND METHOD OF MANUFACTURING THE SAME

(71) Applicant: LG Innotek Co., Ltd., Seoul (KR)

(72) Inventor: Jung Hun Jang, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/264,398

(22) Filed: Apr. 29, 2014

(65) Prior Publication Data

US 2014/0332849 A1    Nov. 13, 2014

(30) Foreign Application Priority Data

May 9, 2013    (KR) .......................... 10-2013-0052660

(51) Int. Cl.
| | |
|---|---|
| H01L 29/20 | (2006.01) |
| H01L 29/267 | (2006.01) |
| H01L 21/02 | (2006.01) |
| H01L 33/00 | (2010.01) |
| H01L 33/12 | (2010.01) |
| H01L 33/32 | (2010.01) |
| H01L 29/778 | (2006.01) |
| H01L 29/15 | (2006.01) |

(52) U.S. Cl.
CPC .......... *H01L 29/267* (2013.01); *H01L 21/0237* (2013.01); *H01L 21/0254* (2013.01); *H01L 21/0262* (2013.01); *H01L 21/02381* (2013.01); *H01L 21/02447* (2013.01); *H01L 21/02458* (2013.01); *H01L 21/02463* (2013.01); *H01L 21/02494* (2013.01); *H01L 21/02507* (2013.01); *H01L 21/02661* (2013.01); *H01L 29/155* (2013.01); *H01L 29/7783* (2013.01); *H01L 33/007* (2013.01); *H01L 33/12* (2013.01); *H01L 33/32* (2013.01)

(58) Field of Classification Search
CPC ................... H01L 21/02381; H01L 21/02458; H01L 21/02507; H01L 21/0254; H01L 29/2003
See application file for complete search history.

(56) References Cited

U.S. PATENT DOCUMENTS

| | | | |
|---|---|---|---|
| 2008/0048207 A1 | 2/2008 | Semond et al. | 257/103 |
| 2012/0292632 A1 | 11/2012 | Shioda et al. | 257/76 |
| 2013/0026482 A1* | 1/2013 | Fenwick | 257/76 |

FOREIGN PATENT DOCUMENTS

| | | | |
|---|---|---|---|
| EP | 2 472 605 A1 | | 7/2012 |
| WO | WO 2013/045355 A1 | | 4/2013 |

OTHER PUBLICATIONS

European Search Report dated Oct. 8, 2014 issued in Application No. 14 162 571.5.

* cited by examiner

*Primary Examiner* — Matthew W Such
*Assistant Examiner* — Scott Stowe
(74) *Attorney, Agent, or Firm* — Ked & Associates, LLP

(57) ABSTRACT

A semiconductor device includes a silicon substrate, an initial buffer layer disposed on the silicon substrate and including aluminum nitride (AlN), and a semiconductor device layer disposed on the initial buffer layer and including a semiconductor compound. There is no SiN between the initial buffer layer and the silicon substrate, and a silicon lattice of the silicon substrate directly contacts a lattice of the initial buffer layer.

16 Claims, 15 Drawing Sheets

SEMICONDUCTOR DEVICE AND METHOD OF MANUFACTURING THE SAME

CROSS REFERENCE TO RELATED APPLICATION

This application claims priority under 35 U.S.C. §119 to Korean Patent Application No. 10-2013-0052660, filed in Korea on 9 May 2013, which is hereby incorporated in its entirety by reference as if fully set forth herein.

TECHNICAL FIELD

Embodiments relate to a semiconductor device and a method of manufacturing the same.

BACKGROUND

Group III-V compound semiconductors such as GaN are widely used in optoelectronics and the like due to wide bandgap, adjustable bandgap, and the like. Such GaN semiconductors are generally grown on a sapphire substrate or a silicon carbide (SiC) substrate. However, these substrates are not suitable for large diameter application and, in particular, the SiC substrate is expensive.

FIG. 1 is a view of a general semiconductor device. Referring to FIG. 1, the semiconductor device includes a substrate 5 and an n-type GaN layer 7.

To address the above-described problems, the silicon substrate 5 that is cheaper than the sapphire substrate or the SiC substrate, easily realizes large diameter and has high thermal conductivity is used. However, lattice mismatch between GaN and silicon is very high and there is a very big difference between coefficients of thermal expansion thereof, and thus, various problems that deteriorate crystallinity, such as meltback, cracks, pits, surface morphology defects, and the like, may occur. For example, cracks may be caused by tensile strain occurring when the n-type GaN layer 7 grown at high temperature is cooled.

To address these problems, an initial buffer layer (not shown) such as an AlN layer may be formed on the silicon substrate 5. Even in this case, however, pits may be formed due to growth temperature of AlN, lattice mismatch between silicon and AlN, or the like. In particular, an SiN film 9 having a thickness of about 5 Å to about 10 Å may be formed between the AlN initial buffer layer and the silicon substrate 5 and pinholes may be formed in the initial buffer layer.

For these reasons, there is a need to develop a semiconductor device having a structure that does not cause such problems and may provide good characteristics, even when using the silicon substrate 5.

The above references are incorporated by reference herein where appropriate for appropriate teachings of additional or alternative details, features and/or technical background.

BRIEF DESCRIPTION OF THE DRAWINGS

The embodiments will be described in detail with reference to the following drawings in which like reference numerals refer to like elements wherein.

DESCRIPTION OF SPECIFIC EMBODIMENTS

Figure 1:
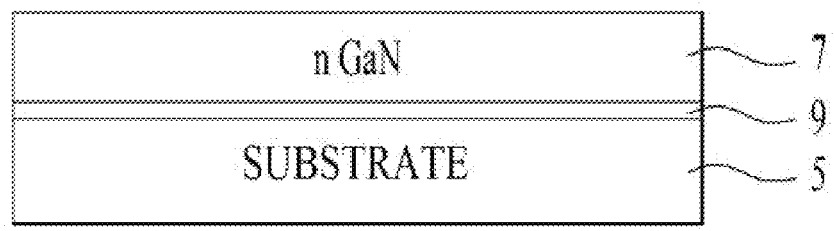
FIG. 1 is a view of a general semiconductor device.

Hereinafter, embodiments will be described in detail with reference to the annexed drawings. However, the disclosure may be embodied in many different forms and should not be construed as being limited to embodiments set forth herein. Rather, these embodiments are provided so that this disclosure will be thorough and complete, and will fully convey the scope of the disclosure to those skilled in the art.

It will be understood that when an element is referred to as being "on" or "under" another element, it can be directly on/under the element or one or more intervening elements may also be present. When an element is referred to as being "on" or "under", "under the element" as well as "on the element" can be included based on the element.

Additionally, relative terms, such as "first" or "second" and "upper" or "lower," may be used herein only to distinguish one entity or element from another entity or element without necessarily requiring or implying physical or logical relationship or order between such entities or elements.

In the drawings, the thickness or size of each layer may be exaggerated, omitted, or schematically illustrated for clarity and convenience of explanation. In addition, the size of each element does not wholly reflect an actual size thereof.

Figure 2:
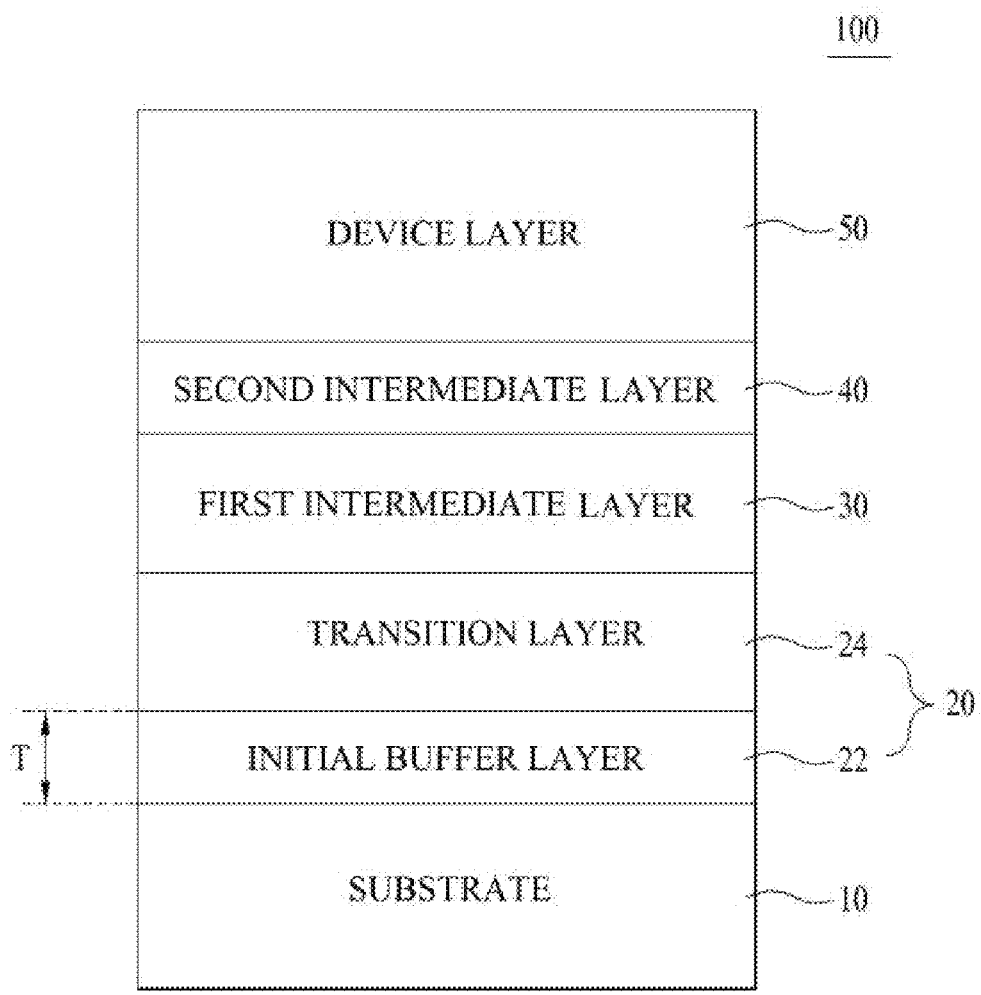
FIG. 2 is a sectional view of a semiconductor device according to an embodiment.

FIG. 2 is a sectional view of a semiconductor device 100 according to an embodiment. Referring to FIG. 2, the semiconductor device 100 includes a substrate 10, a buffer layer 20, a first intermediate layer 30, a second intermediate layer 40, and a device layer 50.

The substrate 10 may include a conductive material or a non-conductive material. For example, the substrate 10 may include at least one of sapphire ($Al_2O_3$), GaN, SiC, ZnO, GaP, InP, $Ga_2O_3$, GaAs, or Si, but the disclosure is not limited thereto. For example, the substrate 10 may be a silicon substrate having a (111) crystal plane as a main plane.

The buffer layer 20 is disposed on the substrate 10 and may include an initial buffer layer 22 and a transition layer 24. The initial buffer layer 22 may serve to prevent melt-back by preventing diffusion of silicon atoms from the silicon substrate 10, to passivate the silicon substrate 10, and to apply compressive strain to a layer on the initial buffer layer 22. For this operation, the initial buffer layer 22 may include, for example, at least one of aluminum nitride (AlN), aluminum arsenide (AlAs), gallium nitride (GaN), AlGaN, or silicon carbide (SiC).

For example, the initial buffer layer 22 may include a material that is different than that of the substrate 10. In particular, according to an embodiment, the initial buffer layer 22 may be formed of AlN.

Figure 3A:
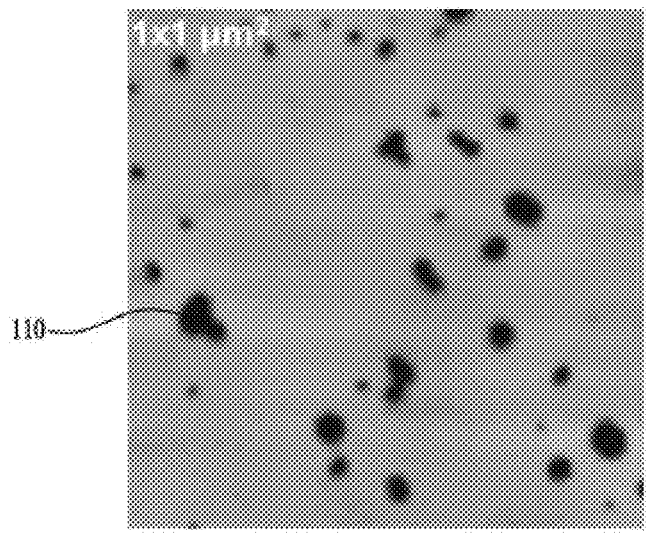
FIGS. 3A and 3B are plan views of an AlN initial buffer layer having a thickness of 120 nm of a conventional semiconductor device.
Figure 3B:
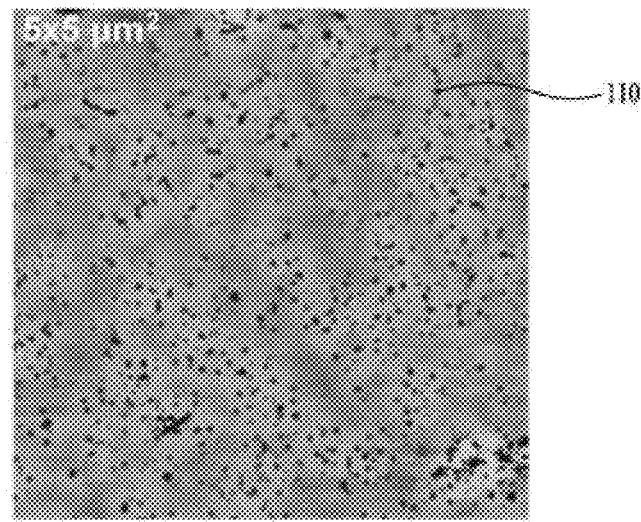

FIGS. 3A and 3B are plan views of an AlN initial buffer layer having a thickness of 120 nm of a conventional semiconductor device.

Figure 4A:
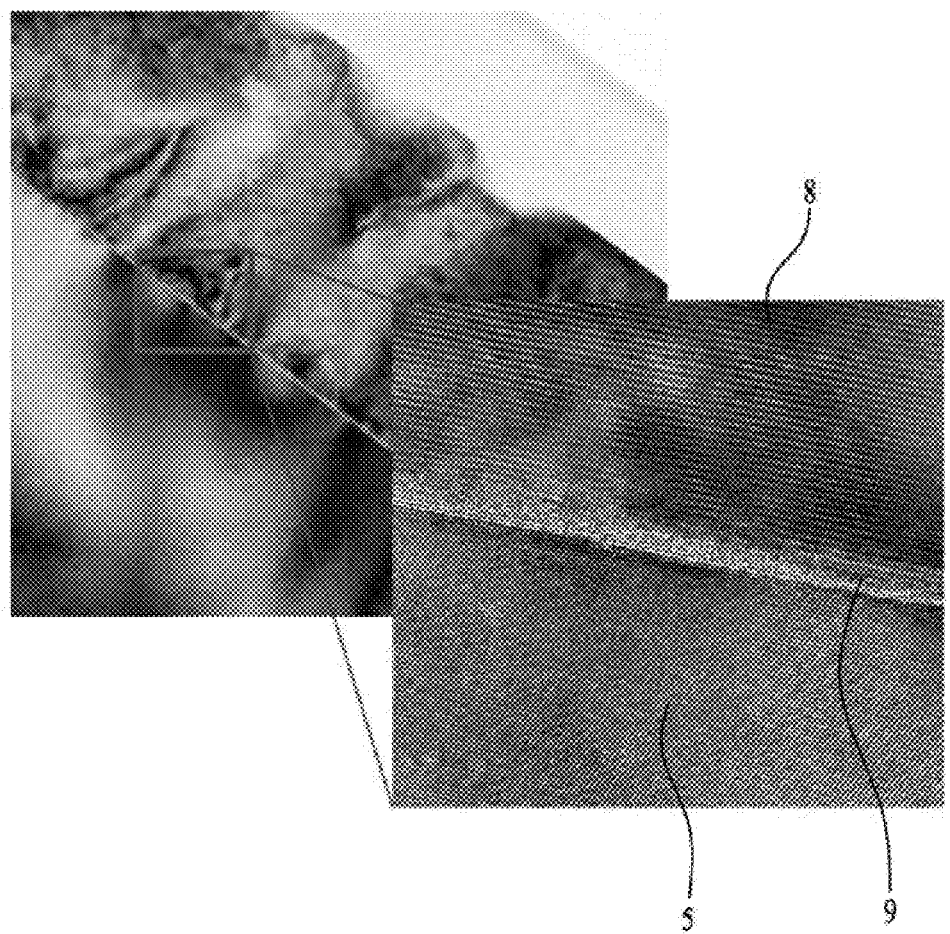
FIGS. 4A and 4B are partial sectional views of a conventional semiconductor device and a semiconductor device according to an embodiment.
Figure 4B:
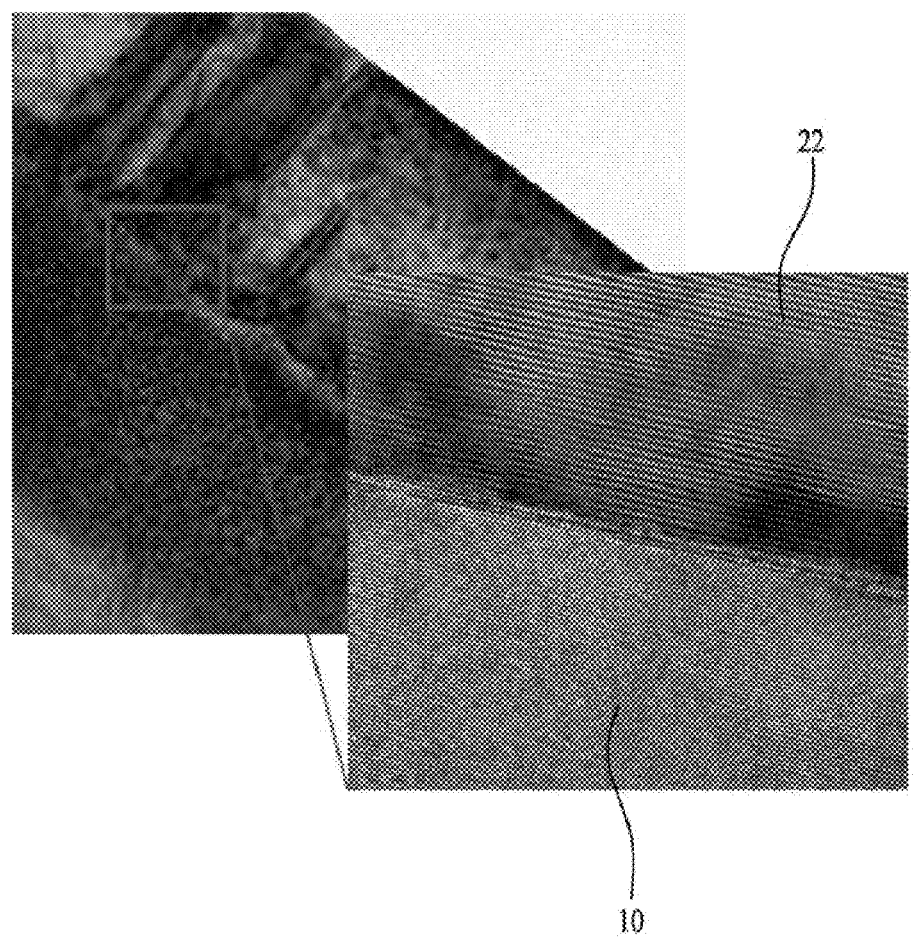

FIGS. 4A and 4B are partial sectional views of a conventional semiconductor device and a semiconductor device according to an embodiment.

In the conventional semiconductor device, an initial buffer layer 8 formed of AlN is grown at a high temperature (HT) of 1050° C. As such, when AlN is grown at a high temperature, nitrogen (N) permeates into the silicon substrate 5 with passing through an Al film and thus, as illustrated in FIG. 4A, silicon nitride (SiN) 9 is formed between the silicon substrate 5 and the AlN initial buffer layer 8 and, as illustrated in FIGS. 3A and 3B, pinholes 110 may be formed in the AlN initial buffer layer 8. As such, when SiN 9 is present between the silicon substrate 5 and the initial buffer layer 8, a silicon lattice of the silicon substrate 5 cannot directly contact the AlN lattice of the initial buffer layer 8.

In addition, in the conventional semiconductor device, when the initial buffer layer 8 has a (002) crystal plane as a main plane, a full width at half maximum (FWHM) of an X-ray rocking curve may be 1289 arcsec at a flat portion of a wafer, 1262 arcsec at an middle portion of the wafer, and 1167 arcsec at another portion excluding the flat portion of the wafer. In this regard, 1 arcsec means $(1/3600)°$.

In addition, in the conventional semiconductor device, roughness of the AlN initial buffer layer 8 has a root mean square (RMS) of 1.29 nm for the case illustrated in FIG. 3A and an RMS of 1.64 nm for the case illustrated in FIG. 3B.

Figure 5A:
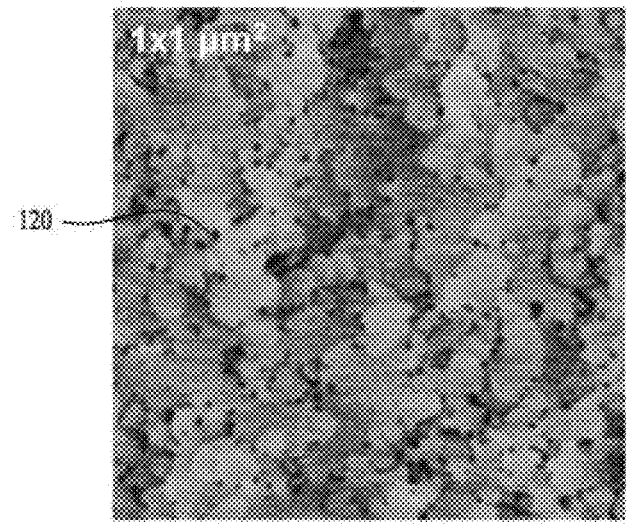
FIGS. 5A and 5B are plan views of an AlN initial buffer layer having a thickness of 120 nm of a semiconductor device according to an embodiment.
Figure 5B:
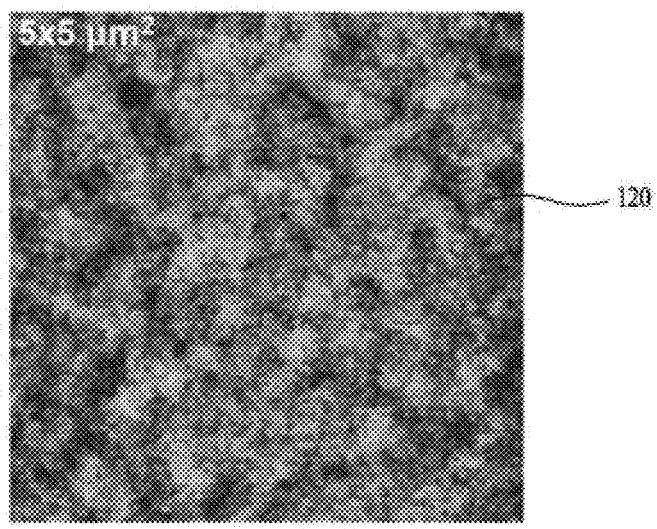

FIGS. 5A and 5B are plan views of an AlN initial buffer layer having a thickness of 120 nm of a semiconductor device according to an embodiment.

Unlike the conventional semiconductor device, according to an embodiment, an ultrathin Al film is first formed at a low temperature of 750° C. to 850° C. that is lower than 1050° C. and then AlN is grown by increasing the temperature to 1000° C. to 1100° C. and thus, as illustrated in FIG. 4B, SiN is not present between the substrate 10 and the initial buffer layer 22. As such, when SiN is not present between the silicon substrate 10 and the initial buffer layer 22, a silicon lattice of the silicon substrate 10 may directly contact the AlN lattice of the initial buffer layer 22.

Thus, as illustrated in FIGS. 5A and 5B, the size, number and depth of pinholes 120 at the initial buffer layer 22 may be less than that of the pinholes 110 of the conventional semiconductor device.

In addition, in an embodiment, when the initial buffer layer 22 has a (002) crystal plane as a main plane, an FWHM of an X-ray rocking curve is 934 arcsec at a flat portion of a wafer, 888 arcsec at a middle portion of the wafer, and 963 arcsec at another portion excluding the flat portion of the wafer. As such, the initial buffer layer 22 may have an FWHM of 600 arcsec to 1000 arcsec.

In addition, in an embodiment, roughness of the initial buffer layer 22 has an RMS of 0.18 nm for the case illustrated in FIG. 5A and an RMS of 0.21 nm for the case illustrated in FIG. 5B. As such, the roughness of the initial buffer layer 22 has an RMS of 0.1 nm to 0.3 nm.

In addition, the initial buffer layer 22 may have a thickness T of several tens to several hundreds of nanometers, for example, 50 nm to 300 nm.

Accordingly, as described above, the semiconductor device according to an embodiment may have enhanced surface morphology and crystallinity when compared to the conventional semiconductor device.

In addition, the transition layer 24 is disposed between the initial buffer layer 22 and the first intermediate layer 30. The transition layer 24 may have various structures.

For example, the transition layer 24 may include at least one AlN/Al$_x$Ga$_{1-x}$N superlattice unit layer. In this regard, the AlN/Al$_x$Ga$_{1-x}$N superlattice unit layer may have a double layer structure including an AlN superlattice layer and an Al$_x$Ga$_{1-x}$N superlattice layer. Here, 0<x<1. In the AlN/Al$_x$Ga$_{1-x}$N superlattice unit layer, relative position of the AlN superlattice layer and the Al$_x$Ga$_{1-x}$N superlattice layer is not limited. For example, the AlN superlattice layer may be a bottom layer and the Al$_x$Ga$_{1-x}$N superlattice layer may be a top layer stacked on the AlN superlattice layer. In another embodiment, in the AlN/Al$_x$Ga$_{1-x}$N superlattice unit layer, the Al$_x$Ga$_{1-x}$N superlattice layer may be a bottom layer and the AlN superlattice layer may be a top layer stacked on the Al$_x$Ga$_{1-x}$N superlattice layer.

For example, the transition layer 24 may include a plurality of AlN/Al$_x$Ga$_{1-x}$N superlattice unit layers. In this regard, the transition layer 24 has a concentration gradient of Al and Ga according to a distance from the initial buffer layer 22. For example, the x values of the AlN/Al$_x$Ga$_{1-x}$N superlattice unit layers may gradually decrease with increasing distance from the initial buffer layer 22.

In another embodiment, the transition layer 24 may include at least one AlGaN layer. In another embodiment, the transition layer 24 may include an AlGaN layer disposed on the initial buffer layer 22 and a GaN layer disposed on the AlGaN layer.

The transition layer 24 may apply gradually increasing compressive strain to the device layer 50 formed of GaN by causing a lattice constant to smoothly change from the initial buffer layer 22 to the GaN device layer 50. Thus, tensile strain caused by the silicon substrate 10 due to a difference between coefficients of thermal expansion may be effectively compensated for and occurrence of cracks may be prevented, whereby crystallinity may be enhanced.

In addition, the transition layer 24 may effectively merge pits caused in the AlN initial buffer layer 22, enhance surface morphology of the GaN device layer 50 by reducing threading dislocation, and may reduce dislocation by bending and thus provide a structure having enhanced crystallinity from the initial buffer layer 22 throughout the device layer 50. Moreover, occurrence of cracks may be prevented and thus mobility of electrons may increase.

In addition, at least one intermediate layer, for example, as illustrated in FIG. 2, at least one of the first and second intermediate layers 30 or 40, may be disposed on the transition layer 24.

The first intermediate layer 30 is disposed between the transition layer 24 and the second intermediate layer 40, applies compressive strain to the device layer 50, and may include an undoped semiconductor compound. For example, the first intermediate layer 30 may include undoped GaN (hereinafter referred to as "uGaN") as the undoped semiconductor compound. The first intermediate layer 30 serves to recover deterioration of crystallinity of the device layer 50 caused because the initial buffer layer 22 and the transition layer 24 include a metal such as Al.

The second intermediate layer 40 is disposed between the first intermediate layer 30 and the device layer 50 and serves to attenuate excessive compressive strain applied to the device layer 50 from the first intermediate layer 30. For this operation, the second intermediate layer 40 may include $Al_yGa_{1-y}N$ where $0<y<1$. For example, y may be 0.6 to 0.8 and the second intermediate layer 40 may have a thickness of 15 nm to 25 nm.

In addition, when the second intermediate layer 40 is formed at a high temperature (HT) of 1000° C. to 1100° C., crystallinity and surface morphology of the device layer 50 may be further enhanced.

In addition, the device layer 50 is disposed on the second intermediate layer 40 and may include a semiconductor compound. For example, the device layer 50 may include doped GaN.

For easily understanding the initial buffer layer 22 in the semiconductor device 100 illustrated in FIG. 2, the transition layer 24 and the first and second intermediate layers 30 and 40, disposed between the initial buffer layer 22 and the device layer 50, are provided for illustrative purposes only, and the disclosure is not limited thereto. That is, between the initial buffer layer 22 and the device layer 50, layers other than the transition layer 24 and the first and second intermediate layers 30 and 40 may be further disposed, only some of the transition layer 24 and the first and second intermediate layers 30 and 40 may be disposed, or the transition layer 24 and the first and second intermediate layers 30 and 40 may not be disposed.

Hereinafter, a method of manufacturing the semiconductor device 100 of FIG. 2 will be described with reference to FIGS. 6A to 6E. In the present embodiment, the substrate 10 is a silicon substrate, the initial buffer layer 22 includes AlN, the transition layer 24 includes AlGaN, the first intermediate layer 30 includes uGaN, and the second intermediate layer 40 includes HT $Al_yGa_{1-y}N$. However, the semiconductor device 100 of FIG. 2 may also be manufactured using various methods other than the method described in the present embodiment.

Figure 7:
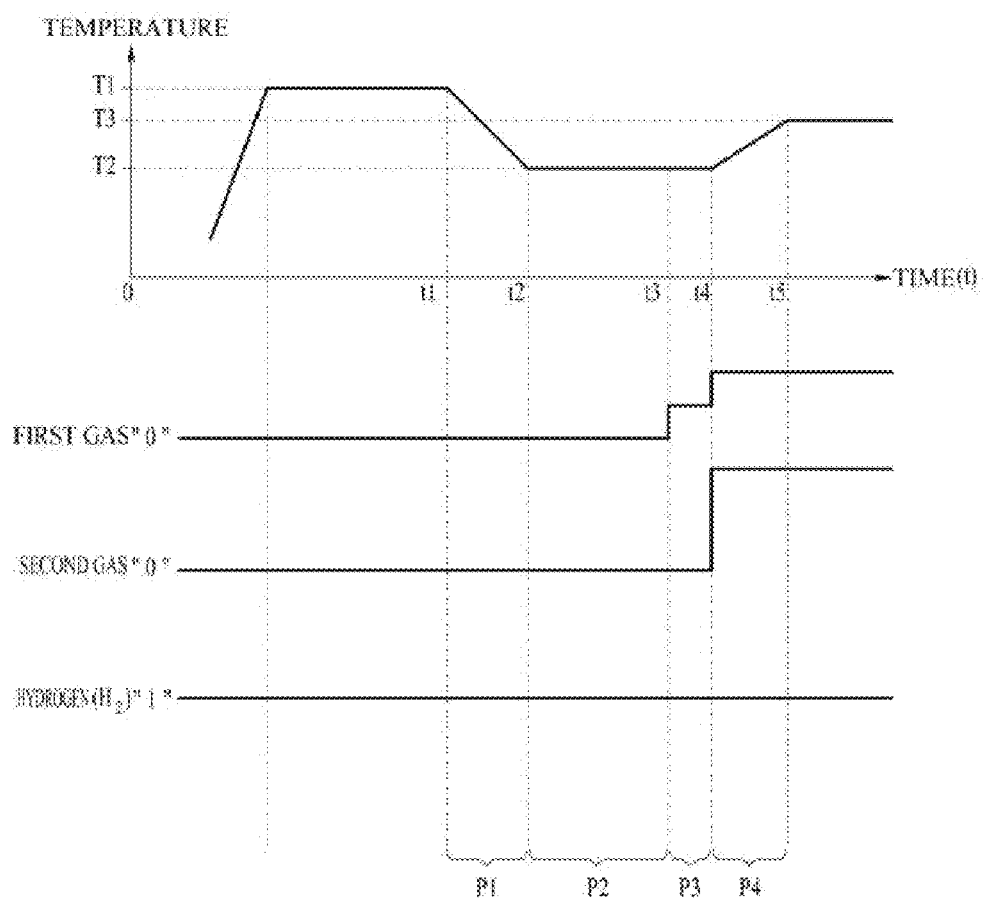
FIG. 7 is a graph for explaining flow of gases for forming an initial buffer layer according to an embodiment.
Figure 8:
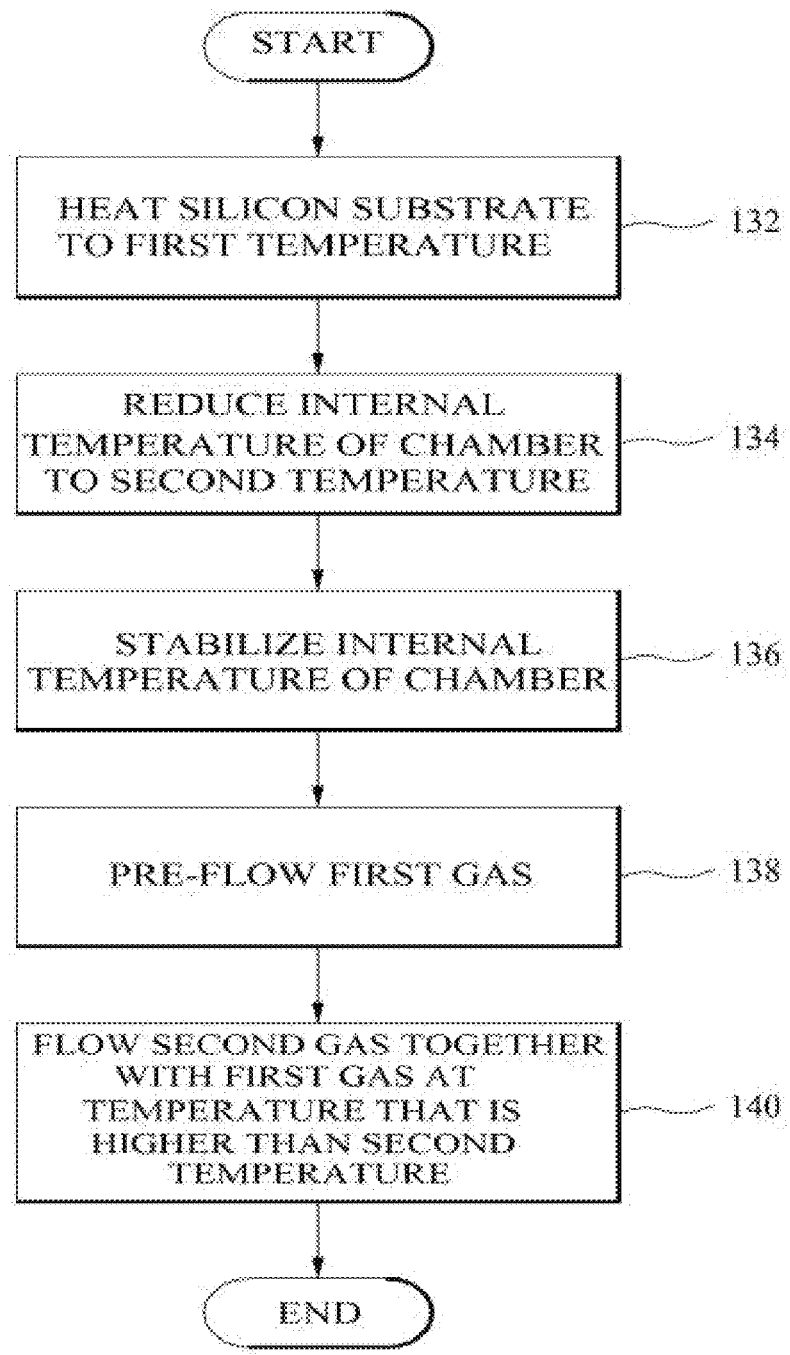
FIG. 8 is a flowchart for explaining a method of manufacturing a semiconductor device, including forming an initial buffer layer, according to an embodiment.

FIGS. 6A to 6E are sectional views for explaining a method of manufacturing the semiconductor device 100 of FIG. 2. FIG. 7 is a graph for explaining flow of gases for forming the initial buffer layer 22 according to an embodiment. FIG. 8 is a flowchart for explaining a method of manufacturing a semiconductor device, including forming the initial buffer layer 22, according to the embodiment.

First, the silicon substrate 10 is prepared and, as illustrated in FIG. 7, the silicon substrate 10 is heated to a first temperature in a chamber (operation 132). For example, the silicon substrate 10 may be heated to 950° C. In this regard, an internal temperature of the chamber is increased from 950° C. to a first temperature T1, i.e., 1050° C. to 1150° C., for example, 1100° C., while flowing hydrogen ($H_2$) into the chamber at a rate of 50 cm³ to 150 cm³ per minute with respect to square centimeters of the silicon substrate 10, and the chamber may be maintained at the temperature for about 10 minutes. Subsequently, a supply rate of $H_2$ is kept constant while growing the initial buffer layer 22. In this regard, $H_2$ serves to remove a natural oxide film on the silicon substrate 10 and to transport an MO source as a precursor, which is a metal organic compound, and acts as an ambient gas.

Subsequently, after operation 132, the internal temperature of the chamber is reduced from the first temperature T1, i.e., 1050° C. to 1150° C., to a second temperature T2 (operation 134). For example, a first predetermined period P1 (t1 to t2) at which the internal temperature of the chamber is transited from the first temperature T1 to the second temperature T2 may be 7.5 minutes, but the disclosure is not limited thereto.

After operation 134, the internal temperature of the chamber is stabilized by maintaining the internal temperature of the chamber at the second temperature T2 for a second predetermined period P2 (t2-t3) before flowing a first gas (operation 136). The second predetermined period P2 for stabilizing the internal temperature of the chamber from the first temperature T1 to the second temperature T2 may be 0 minutes to 5 minutes, for example, 3 minutes.

When the second temperature T2 is less than 750° C., Al and N may be difficult to combine in a subsequent process. When the second temperature T2 exceeds 850° C., nitrogen reaches the silicon substrate 10 by permeating an Al metal layer 22A in a subsequent process and thus SiN is present between the initial buffer layer 22 and the silicon substrate 10 and pinholes may be formed. Thus, according to an embodiment, the second temperature T2 may be 750° C. to 850° C., which is lower than a third temperature T3.

Figure 6A:
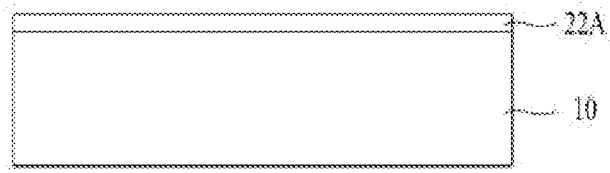
FIGS. 6A to 6E are sectional views illustrating a method of manufacturing the semiconductor device illustrated in FIG. 2.

Subsequently, after operation 136, while the inside of the chamber is maintained at the second temperature T2, only a first gas including Al is pre-flowed for a third predetermined period P3 (t3 to t4) in a state in which a second gas including N is not supplied into the chamber to deposit the ultrathin Al film 22A on the silicon substrate 10, as illustrated in FIG. 6A (operation 138).

In this regard, the first gas is a gas including Al and may include, for example, trimethylaluminum ($Al_2$ $(CH_3)_5$) (TMAl) gas. The amount of TMAl gas pre-flowed for the third predetermined period P3 may be about 100 micro moles (μmol)/min to about 150 μmol/min.

When the third predetermined period P3 is less than 5 seconds, the ultrathin Al film 22A is deposited to a small thickness and thus, when the second gas including N is flowed in a subsequent process, N permeates the ultrathin Al film 22A and, as a result, pinholes may be easily formed. On the other hand, when the third predetermined period P3 exceeds 15 seconds, crystallinity of the device layer 50 formed on the initial buffer layer 22 may be deteriorated. Thus, the third predetermined period P3 may be 5 seconds to 15 seconds, for example, 10 seconds.

Figure 6B:
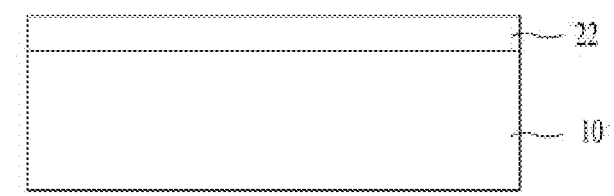

Subsequently, after operation 138, i.e., after the third predetermined period P3 elapses, the internal temperature of the chamber is increased to a temperature higher than the second temperature T2 and the second gas is flowed together with the first gas to complete growth of the initial buffer layer 22 formed of AlN on the silicon substrate 10, as illustrated in FIG. 6B (operation 140). In this regard, the second gas is an N-containing gas and may be, for example, ammonia ($NH_3$) gas. Dependent to the degree of the reaction of the first gas and the second gas, in an embodiment, the formed initial buffer layer may comprise an ultrathin Al film deposited on the silicon substrate and an AlN layer on the Al film and the silicon lattice of the silicon substrate directly contacts a lattice of the Al film of initial buffer layer, and in another embodiment, the formed initial buffer layer is an AlN layer and the silicon lattice of the silicon substrate directly contacts an AlN lattice of the initial buffer layer.

Hereinafter, operation 140 will be described in more detail. First, $NH_3$ gas as the second gas is flowed into the chamber while increasing the internal temperature of the reaction chamber from the second temperature T2 to the third temperature T3 for a fourth predetermined period P4. The third temperature T3 may be higher than the second temperature T2, and a difference between the second temperature T2 and the third temperature T3 may be 200° C. to 300° C. For example, the third temperature T3 may be 1000° C. to 1100° C. In addition, the fourth predetermined period P4 may be 3 minutes to 15 minutes, for example, 10 minutes. The first gas including Al is also supplied for the fourth predetermined period P4 at which $NH_3$ gas is supplied. A larger pre-flow amount of the first gas than that for the third predetermined period P3 may be supplied for the fourth predetermined period P4. For example, the amount of the first gas pre-flowed for the fourth predetermined period P4 may be 200 μmol to 300 μmol. In addition, $NH_3$ gas as the second gas may be supplied in an amount of less than 0.01% per unit volume of $H_2$.

Next, after the internal temperature of the chamber is increased to the third temperature T3, i.e., after time t5, the first and second gases are flowed together. In this regard, a supply ratio of the first gas to the second gas, i.e., first gas: second gas, may be 1:100 to 1:1500.

Unlike what has been described above, when the internal temperature of the chamber is maintained at a high temperature, e.g., the third temperature T3 that is higher than the second temperature T2 while the first and second gases are supplied to form the initial buffer layer 22 formed of AlN, nitrogen included in the second gas may reach the silicon substrate 10 by permeating the ultra Al film 22A illustrated in FIG. 6A. In this case, SiN is formed between the silicon substrate 10 and the initial buffer layer 22 and a larger number of deep and big pinholes may be formed in the initial buffer layer 22.

However, as in the above-described embodiment, when the second gas including N is flowed together with the first gas at a temperature that is higher than the second temperature T2 after pre-flowing the first gas including Al at the second temperature T2 that is lower than the third temperature T3, i.e., after time t4, diffusion of nitrogen becomes less vigorous and thus it is difficult for nitrogen to permeate the ultrathin Al film 22A. Thus, formation of SiN between the initial buffer layer 22 and the silicon substrate 10 may be prevented and formation of a large number of deep and big pinholes in the initial buffer layer 22 may be prevented.

Figure 6C:
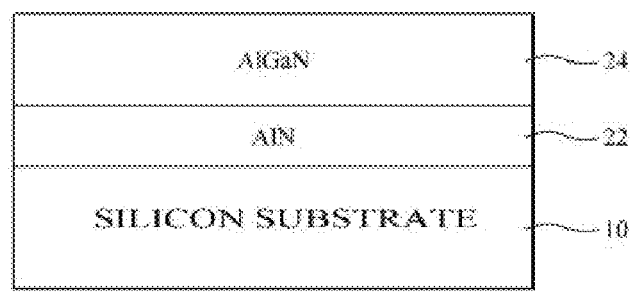
Figure 6D:
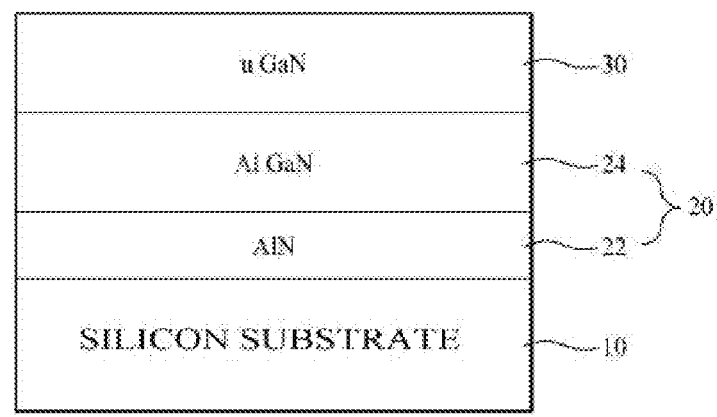

Subsequently, as illustrated in FIG. 6C, the transition layer 24 including AlGaN is formed on the initial buffer layer 22 including AlN. Subsequently, as illustrated in FIG. 6D, the first intermediate layer 30 including uGaN is formed on the transition layer 24 including AlGaN.

Figure 6E:
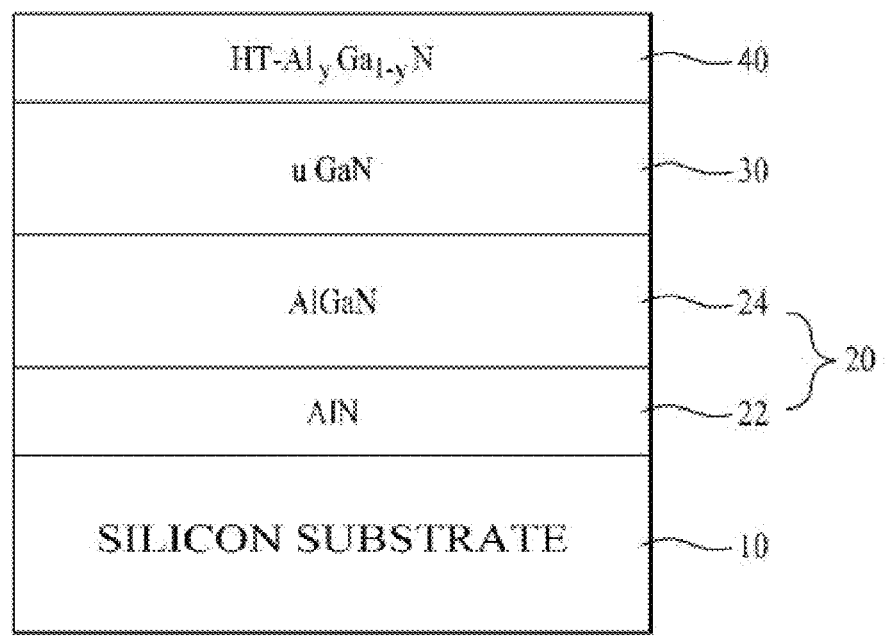

Subsequently, as illustrated in FIG. 6E, an HT $Al_yGa_{1-y}N$ layer as the second intermediate layer 40 may be formed on the first intermediate layer 30 including uGaN. Subsequently, an n-type GaN layer as the device layer 50 may be formed on the second intermediate layer 40, as illustrated in FIG. 2.

In the manufacturing method described above with reference to FIGS. 6A to 6E, Ga, Al, and N may be grown by metal organic chemical vapor deposition (MOCVD). That is, a structure including Ga, Al, and N may be formed using a precursor material including trimethyl gallium (TMG), TMAl, and $NH_3$ by MOCVD.

Meanwhile, the semiconductor device 100 of FIG. 2 may be used in various fields. For example, the semiconductor device 100 of FIG. 2 may be applied to a light emitting device such as a light emitting diode (LED), for example, a horizontal light emitting device or a vertical light emitting device.

Figure 9:
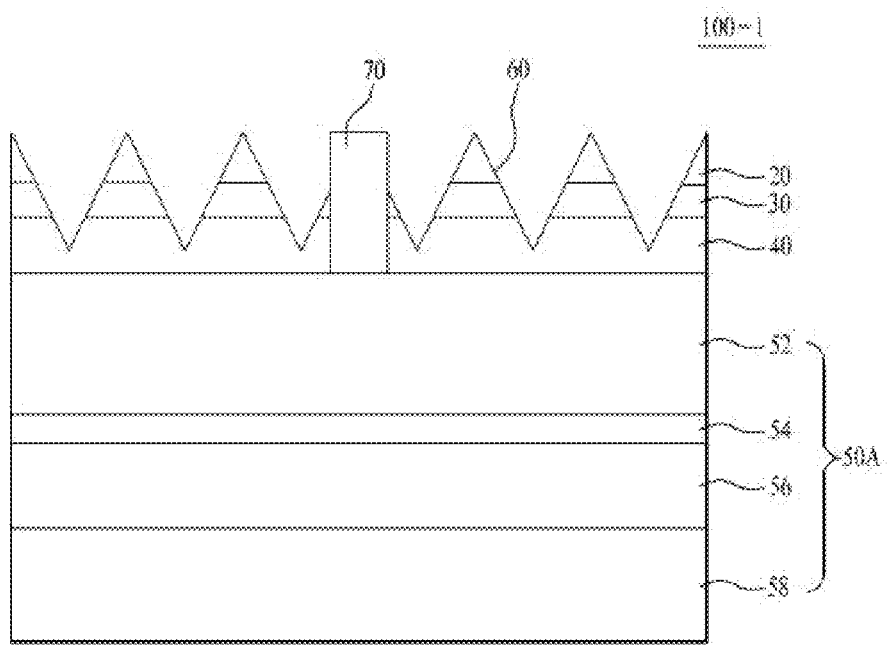
FIG. 9 is a sectional view of a semiconductor device according to an embodiment, embodied as a vertical light emitting device using the semiconductor device illustrated in FIG. 2.

Referring to FIG. 9, the semiconductor device 100-1 embodied as a vertical light emitting device includes a conductive type support substrate 58, a first conductive type semiconductor layer 56, an active layer 54, a second conductive type semiconductor layer 52, a second intermediate layer 40, a first intermediate layer 30, and a buffer layer 20. The buffer layer 20, the first intermediate layer 30, and the second intermediate layer 40, illustrated in FIG. 9, respectively correspond to the buffer layer 20, the first intermediate layer 30, and the second intermediate layer 40 illustrated in FIG. 2 and thus a detailed description thereof will be omitted herein. In addition, a light emitting structure illustrated in FIG. 9 (i.e., the second conductive type semiconductor layer 52, the active layer 54, and the first conductive type semiconductor layer 56) and the conductive type support substrate 58 correspond to an embodiment (i.e., a device layer 50A) of the device layer 50 illustrated in FIG. 2.

The conductive type support substrate 58 may act as a first electrode together with an ohmic layer (not shown) and a reflective layer (not shown) and thus may use a metal with high electrical conductivity. In addition, the conductive type support substrate 58 needs to sufficiently dissipate heat generated when a light emitting device operates and thus may use a metal with high thermal conductivity. In this regard, the ohmic layer and the reflective layer are known in the art and a detailed description thereof will be omitted herein. In another embodiment, a separate first electrode (not shown) may be disposed below the conductive type support substrate 58.

For example, the conductive type support substrate 58 may be formed of a material selected from the group consisting of molybdenum (Mo), silicon (Si), tungsten (W), copper (Cu), and aluminum (Al) or an alloy thereof. In addition, the conductive type support substrate 58 may selectively include gold (Au), a Cu alloy, nickel (Ni), Cu—W, a carrier wafer (e.g., GaN, Si, Ge, GaAs, ZnO, SiGe, SiC, SiGe, $Ga_2O_3$, or the like), or the like.

In addition, the conductive type support substrate 58 may prevent bending of the entire nitride semiconductor and have a mechanical strength sufficient to be easily separated into a separate chip through scribing and breaking.

The light emitting structure may include the first conductive type semiconductor layer 56 disposed on the conductive type support substrate 58, the active layer 54 disposed on the first conductive type semiconductor layer 56, and the second conductive type semiconductor layer 52 disposed on the active layer 54.

The first conductive type semiconductor layer 56 may include a Group III-V compound semiconductor doped with a first conductive type dopant and include a semiconductor material having the formula AlkInzGa(1−k−z)N where $0≤k≤1$, $0≤z≤1$, $0≤k+z≤1$. For example, the first conductive type semiconductor layer 56 may be formed of at least one selected from among GaN, InN, AlN, InGaN, AlGaN, InAlGaN, AlInN, AlGaAs, InGaAs, AlInGaAs, GaP, AlGaP, InGaP, AlInGaP, and InP. In addition, the first conductive type dopant may be a p-type dopant such as Mg, Zn, Ca, Sr, Ba, or the like, but the disclosure is not limited thereto.

The active layer 54 is a layer in which holes (or electrons) injected via the first conductive type semiconductor layer 56 and electrons (or holes) injected via the second conductive type semiconductor layer 52 are recombined to emit light with energy determined by an intrinsic energy band of a material constituting the active layer 54.

The active layer 54 may have at least one of a single well structure, a multiwell structure, a single quantum well structure, a multiple quantum well (MQW) structure, a quantum wire structure, or a quantum dot structure. For example, the active layer 54 may have an MQW structure through injection of trimethyl gallium (TMG) gas, ammonia (NH3) gas, nitrogen (N2) gas, and trimethyl indium (TMIn) gas, but the disclosure is not limited thereto.

A well layer/barrier layer of the active layer 54 may be formed of at least one pair structure of InGaN/GaN, InGaN/InGaN, GaN/AlGaN, InAlGaN/GaN, GaAs(InGaAs)/AlGaAs, or GaP(InGaP)/AlGaP, but the disclosure is not limited thereto. The well layer may be formed of a material having a smaller bandgap than that of the barrier layer.

The second conductive type semiconductor layer 52 may include a Group III-V compound semiconductor doped with a second conductive type dopant and include a semiconductor material having the formula $In_kAl_zGa_{1-k-z}N$ where $0 \leq k \leq 1$, $0 \leq z \leq 1$, and $0 \leq k+z \leq 1$. For example, when the second conductive type semiconductor layer 52 is an n-type semiconductor layer, the second conductive type dopant may be an n-type dopant such as Si, Ge, Sn, Se, or Te, but the disclosure is not limited thereto.

In the light emitting structure described above, the first conductive type semiconductor layer 56 is formed as a p-type semiconductor layer and the second conductive type semiconductor layer 52 is formed as an n-type semiconductor layer. However, in another embodiment, the first conductive type semiconductor layer 56 may be formed as an n-type semiconductor layer and the second conductive type semiconductor layer 52 may be formed as a p-type semiconductor layer. That is, the light emitting structure may be embodied as any one of an n-p junction structure, a p-n junction structure, an n-p-n junction structure, and a p-n-p junction structure.

In addition, to enhance luminous efficacy, a roughness structure 60 may be arranged above the second conductive type semiconductor layer 52. The roughness structure 60 may be a sawtooth structure as shown in FIG. 9 or an uneven structure and such a sawtooth or uneven structure may be periodically or non-periodically arranged.

As illustrated in FIG. 9, the roughness structure 60 may be formed only at the buffer layer 20, the first intermediate layer 30, and the second intermediate layer 40. In another embodiment, unlike what has been illustrated in FIG. 9, the roughness structure 60 may be formed only at the buffer layer 20, only at the buffer layer 20 and the first intermediate layer 30, or at all of the buffer layer 20, the first intermediate layer 30, the second intermediate layer 40, and the second conductive type semiconductor layer 52.

A second electrode 70 may be formed on the second conductive type semiconductor layer 52. The second electrode 70 may be formed of a metal or a material for forming a reflective electrode having ohmic characteristics. For example, the second electrode 70 may have a single layer structure or a multilayer structure including at least one of Al, titanium (Ti), chromium (Cr), Ni, Cu, or Au.

Hereinafter, a method of manufacturing the semiconductor device 100-1 illustrated in FIG. 9 will be described with reference to FIGS. 6A to 6E and 10A to 10C. In the present embodiment, the substrate 10 is a silicon substrate, the initial buffer layer 22 includes AlN, the transition layer 24 includes AlGaN, the first intermediate layer 30 includes uGaN, the second intermediate layer 40 includes HT-$Al_yGa_{1-y}N$, the first conductive type semiconductor layer 56 includes p-type GaN, and the second conductive type semiconductor layer 52 includes n-type GaN. However, the semiconductor device 100-1 of FIG. 9 may also be manufactured using various methods other than the above-described manufacturing method.

Figure 10A:
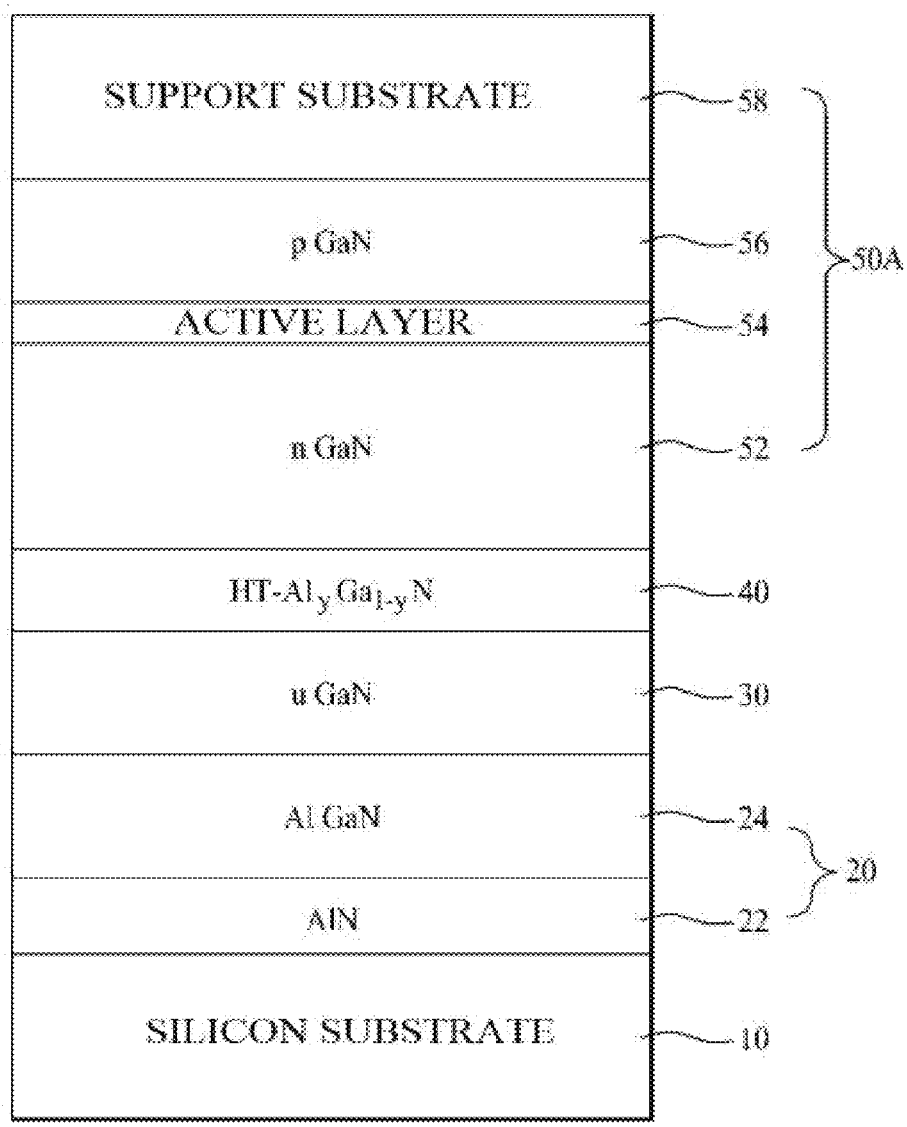
FIGS. 10A to 10C are sectional views for explaining a method of manufacturing the semiconductor device illustrated in FIG. 9.
Figure 10B:
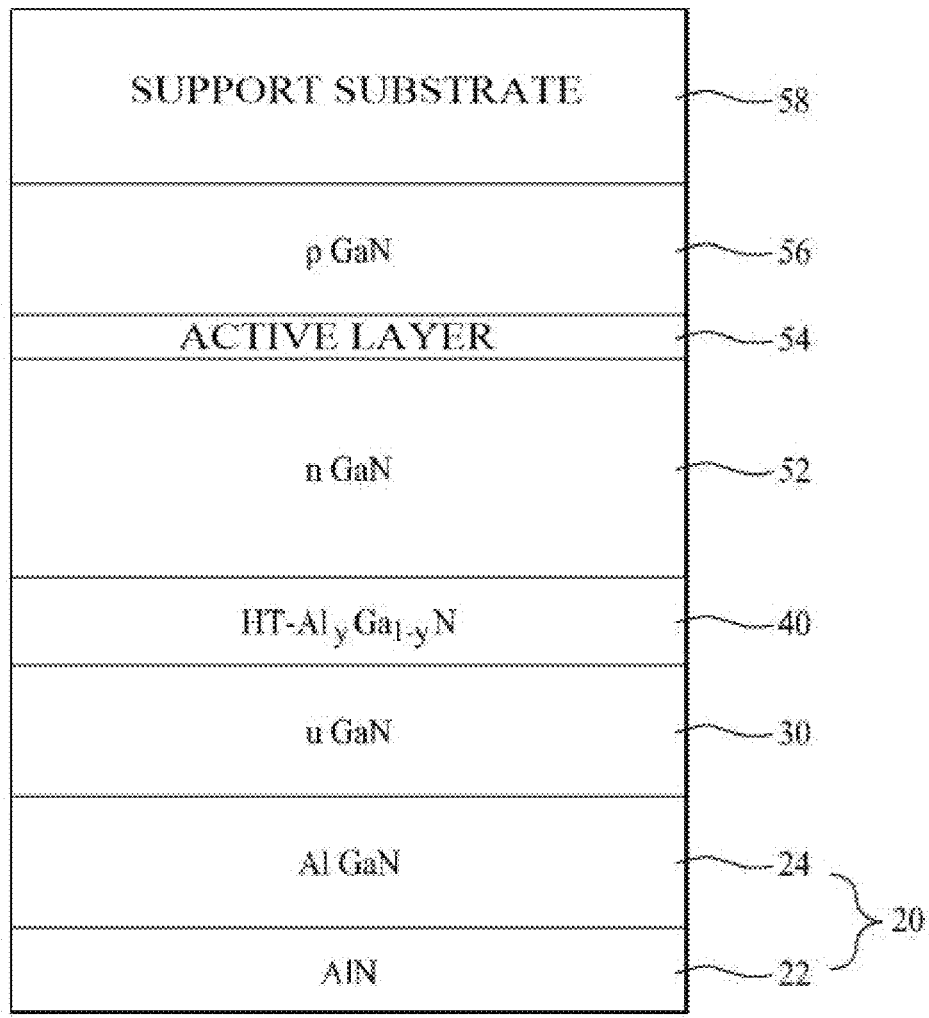
Figure 10C:
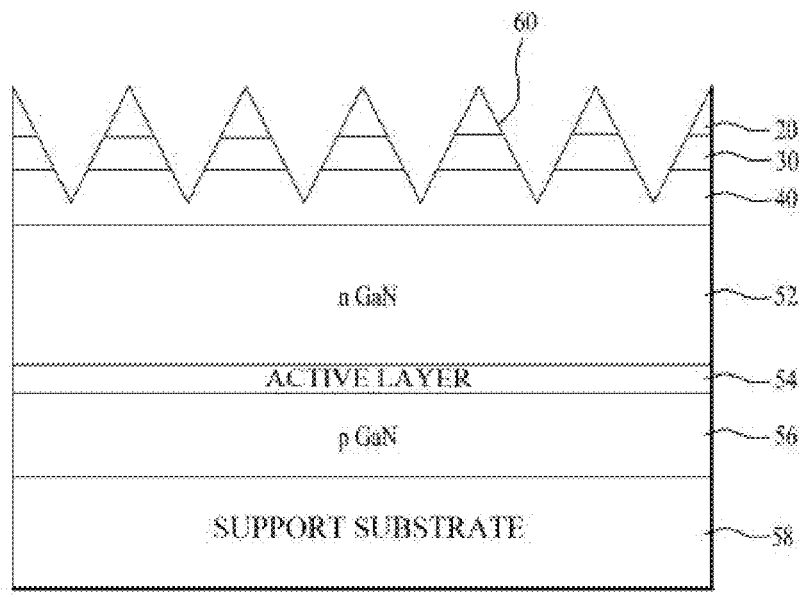

FIGS. 10A to 10C are sectional views for explaining a method of manufacturing the semiconductor device 100-1 of FIG. 9, according to an embodiment. As described above with reference to FIGS. 6A to 6E, the silicon substrate 10, the initial buffer layer 22 formed of AlN, the transition layer 24 formed of AlGaN, the first intermediate layer 30 formed of uGaN, and the second intermediate layer 40 formed of HT-$Al_xGa_{1-x}N$ are formed.

Subsequently, as illustrated in FIG. 10A, an n-type GaN layer as the second conductive type semiconductor layer 52, the active layer 54, a p-type GaN layer as the first conductive type semiconductor layer 56, and the conductive type support substrate 58 are sequentially stacked on the second intermediate layer 40, thereby forming the device layer 50A.

Subsequently, as illustrated in FIG. 10B, the silicon substrate 10 is removed by wet etching. Subsequently, the resulting structure illustrated in FIG. 10B is turned upside down and, as illustrated in FIG. 10C, the roughness structure 60 and the second electrode 70 are formed at the resulting structure.

Hereinbefore, the semiconductor device 100-1 embodied as a light emitting device having a vertical type using the semiconductor device 100 of FIG. 2 has been described, but the disclosure is not limited thereto. That is, a light emitting device having a horizontal type may be embodied using the semiconductor device 100 of FIG. 2. In this case, in FIG. 10A, instead of the conductive type support substrate 58 being formed on the first conductive type semiconductor layer 56, the first conductive type semiconductor layer 56, the active layer 54, and the second conductive type semiconductor layer 52 may be mesa-etched so as to expose the second conductive type semiconductor layer 52, a second electrode (not shown) may be formed on an exposed portion of the second conductive type semiconductor layer 52, and a first electrode (not shown) may be formed on the first conductive type semiconductor layer 56.

Meanwhile, the semiconductor device 100 of FIG. 2 may be used for power devices such as a high electron mobility transistor (HEMT), a heterostructure field effect transistor (HFET), a double HFET, and the like as well as the light emitting device.

Hereinafter, an HEMT 100-2 using the semiconductor device 100 of FIG. 2 will be described below with reference to FIG. 11. In this regard, the same reference numerals of FIG. 11 as those of FIG. 2 denote like elements and thus a detailed description thereof will be omitted herein.

Figure 11:
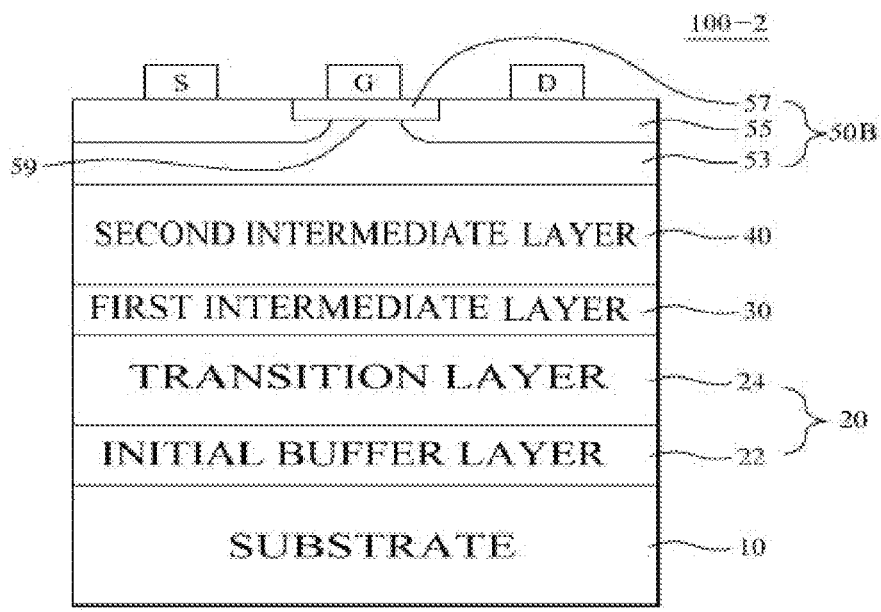
FIG. 11 is a sectional view of a semiconductor device according to another embodiment, embodied as a high electron mobility transistor (HEMT) using the semiconductor device of FIG. 2.

FIG. 11 is a sectional view of a semiconductor device 100-2 according to another embodiment, which is embodied as an HEMT using the semiconductor device 100 of FIG. 2.

Referring to FIG. 11, the semiconductor device 100-2 includes the substrate 10, the initial buffer layer 22, the transition layer 24, the first intermediate layer 30, the second intermediate layer 40, and a device layer 50B.

The device layer 50B corresponds to the device layer 50 of FIG. 2. In this regard, the device layer 50B includes a channel layer 53, an undoped AlGaN layer 57 (hereinafter referred to as a uAlGaN layer), an n-type or p-type GaN layer 55, a gate electrode G, and plural contacts S and D.

The channel layer 53 may be formed including undoped GaN and is disposed on the second intermediate layer 40. The uAlGaN layer 57 is disposed on an upper portion of the channel layer 53 via a heterojunction 59. In addition, the gate electrode G formed using a material such as gold (Au) is disposed on the uAlGaN layer 57.

When a channel formed by the channel layer 53 is an n-type channel, the n-type GaN layer 55 is disposed on an upper portion of the channel layer 53 and at opposite sides of the uAlGaN layer 57. When a channel formed by the channel layer 53 is a p-type channel, however, the p-type GaN layer 55 is disposed on an upper portion of the channel layer 53 and at opposite sides of the uAlGaN layer 57. The GaN layer 55 may be buried in the channel layer 53.

At least one of the contacts S and D is disposed on the GaN layer 55 and at opposite sides of the uAlGaN layer 57. In this regard, the at least one of the contacts S and D may include a source contact S that may be formed of Al and a drain contact D that may be formed of Al. The source contact S is disposed on the GaN layer 55 disposed on the channel layer 53, and the drain contact D is disposed on the GaN layer 55 to be spaced apart from the source contact S.

In addition, the semiconductor device 100 of FIG. 2 may be applied to various fields such as a photodetector, a gated bipolar junction transistor, a gated hot electron transistor, a gated heterostructure bipolar junction transistor, a gas sensor, a liquid sensor, a pressure sensor, a multi-function sensor having pressure and temperature sensor functions, a power switching transistor, a microwave transistor, a lighting device, and the like.

Hereinafter, configuration and operation of a light emitting device package including the semiconductor device 100-1 of FIG. 9 applied to a light emitting device having the vertical type will be described.

Figure 12:
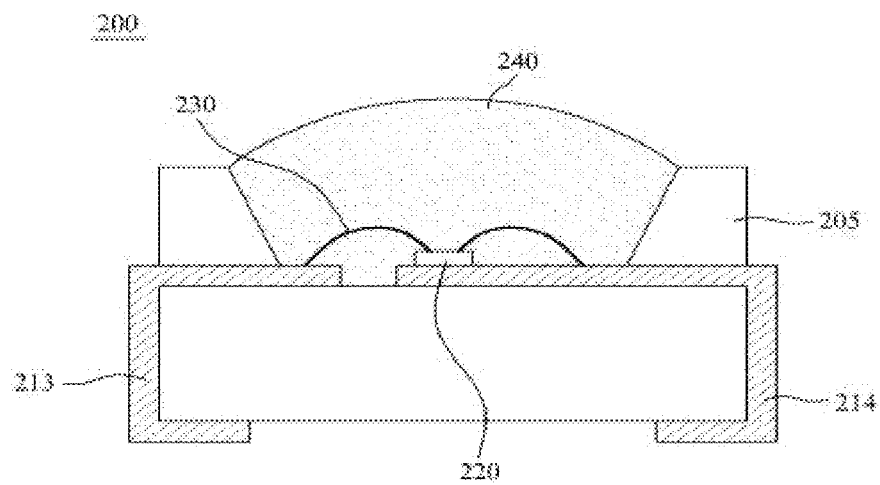
FIG. 12 is a sectional view of a light emitting device package according to an embodiment.

FIG. 12 is a sectional view of a light emitting device package 200 according to an embodiment of the present application. The light emitting device package 200 according to the present embodiment includes a package body part 205, first and second lead frames 213 and 214 installed at the package body part 205, a light emitting device 220 disposed at the package body part 205 to be electrically connected to the first and second lead frames 213 and 214, and a molding member 240 to surround the light emitting device 220.

The package body part 205 may be formed using silicon, a synthetic resin, or a metal and may have inclined surfaces formed in the vicinity of the light emitting device 220. The first and second lead frames 213 and 214 are electrically insulated from each other and serve to supply power to the light emitting device 220. In addition, the first and second lead frames 213 and 214 may enhance luminous efficacy by reflecting light emitted from the light emitting device 220 and dissipate heat generated by the light emitting device 220 to the outside.

The light emitting device 220 may include the semiconductor device 100-1 illustrated in FIG. 9, but the disclosure is limited thereto. The light emitting device 220 may be disposed on the first or second lead frame 213 or 214 as illustrated in FIG. 12, or on the package body part 205.

The light emitting device 220 may be electrically connected to the first lead frame 213 and/or the second lead frame 214 by any one of a wire method, a flip-chip method, and a die-bonding method. The light emitting device 220 illustrated in FIG. 12 is electrically connected to the first and second lead frames 213 and 214 via wires 230, but the disclosure is not limited thereto.

The molding member 240 may surround the light emitting device 220 to protect the light emitting device 220. In addition, the molding member 240 may include a phosphor and thus change a wavelength of light emitted from the light emitting device 220.

A plurality of light emitting device packages according to an embodiment is arrayed on a substrate, and optical members such as a light guide plate, a prism sheet, a diffusion sheet, a fluorescent sheet, and the like may be disposed on an optical path of light emitted from the light emitting device packages. The light emitting device packages, the substrate, and the optical members may function as a backlight unit or a lighting unit. For example, a lighting system may include a backlight unit, a lighting unit, an indicating device, lamps, street lamps, and the like.

Figure 13:
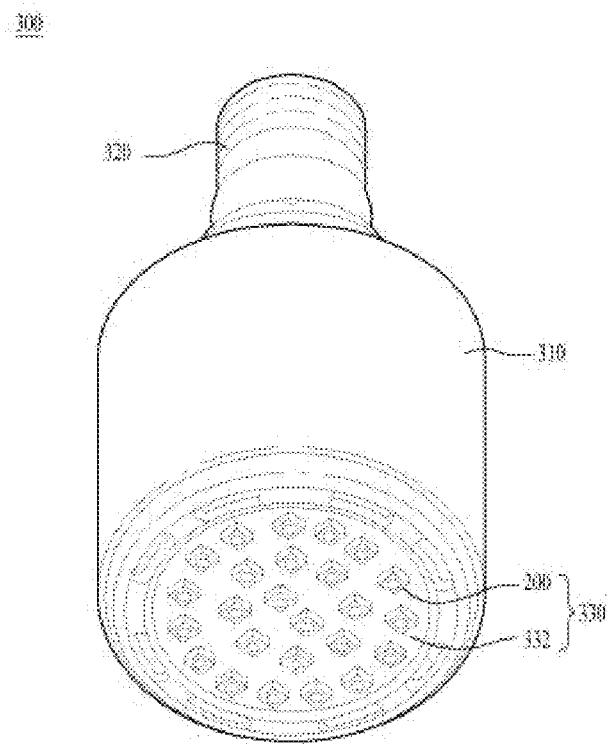
FIG. 13 is a perspective view of a lighting unit according to an embodiment.

FIG. 13 is a perspective view of a lighting unit 300 according to an embodiment. The lighting unit 300 of FIG. 13 is given as one example of a lighting system and the disclosure is not limited thereto. In the present embodiment, the lighting unit 300 may include a case body 310, a connection terminal 320 installed at the case body 310 and receiving power from an external power supply, and a light emitting module unit 330 installed at the case body 310. The case body 310 may be formed of a material having good heat dissipation characteristics, for example, a metal or a resin.

The light emitting module unit 330 may include a substrate 332 and at least one light emitting device package 200 mounted on the substrate 332. The substrate 332 may be formed by printing a circuit pattern on an insulator. For example, the substrate 332 may include a general printed circuit board (PCB), a metal core PCB, a flexible PCB, a ceramic PCB, and the like. In addition, the substrate 332 may be formed of a material to effectively reflect light, or the substrate 332 may have a colored surface to effectively reflect light, e.g., a white or silver surface.

The at least one light emitting device package 200 may be mounted on the substrate 332. The light emitting device package 200 may include at least one light emitting device 220, e.g., a light emitting diode (LED). The LED may include a colored LED such as a red LED, a green LED, or a white LED and a UV LED to emit ultraviolet (UV) light.

The light emitting module unit 330 may be configured to have various combinations of the light emitting device packages 200 to acquire desired color and brightness. For example, to acquire a high color rendering index (CRI), white, red and green LEDs may be arranged in combination.

The connection terminal 320 may be electrically connected to the light emitting module unit 330 to supply power. In the embodiment, the connection terminal 320 is spirally fitted in and coupled to an external power supply in a socket coupling manner, but the disclosure is not limited thereto. For example, the connection terminal 320 may take the form of a pin to be inserted into an external power supply, or may be connected to an external power supply via a wiring.

Figure 14:
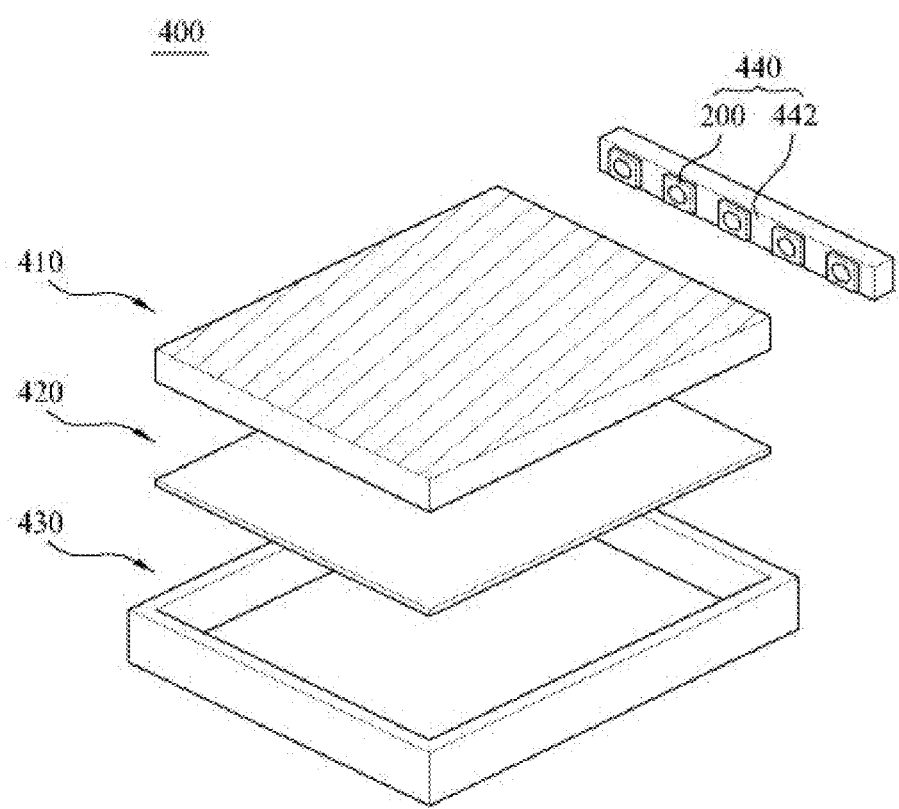
FIG. 14 is an exploded perspective view of a backlight unit according to an embodiment.

FIG. 14 is an exploded perspective view of a backlight unit 400 according to an embodiment. The backlight unit 400 of FIG. 14 is given as one example of a lighting system and the disclosure is not limited thereto.

The backlight unit 400 according to the present embodiment includes a light guide plate 410, a reflective member 420 disposed below the light guide plate 410, a bottom cover 430, and a light emitting module unit 440 to supply light to the light guide plate 410. The bottom cover 430 accommodates the light guide plate 410, the reflective member 420, and the light emitting module unit 440.

The light guide plate 410 serves to convert a point light source into a surface light source by diffusing light. The light guide plate 410 may be formed of a transparent material. For example, the light guide plate 410 may include one of an acrylic resin such as polymethylmethacrylate (PMMA), polyethylene terephthalate (PET) resin, polycarbonate (PC) resin, cycloolefin copolymer (COC) resin, and polyethylene naphthalate (PEN) resin.

The light emitting module unit 440 supplies light to at least one side surface of the light guide plate 410 and, ultimately, acts as a light source of a display device at which a backlight unit is installed.

The light emitting module unit 440 may contact the light guide plate 410, but the disclosure is not limited thereto. In particular, the light emitting module unit 440 includes a substrate 442 and the light emitting device packages 200 mounted on the substrate 442. The substrate 442 may contact the light guide plate 410, but the disclosure is not limited thereto.

The substrate 442 may be a PCB including a circuit pattern (not shown). However, in another embodiment, the substrate 442 may be a general PCB, a metal core PCB (MCPCB), a flexible PCB, or the like, but the disclosure is not limited thereto. In addition, the light emitting device packages 200 may be mounted on the substrate 442 such that a light emitting surface is spaced apart from the light guide plate 410 by a predetermined distance.

The reflective member 420 may be formed below the light guide plate 410. The reflective member 420 reflects light incident upon a lower surface of the light guide plate 410 to direct light upward and thus may enhance brightness of the backlight unit 400. The reflective member 420 may be formed of, for example, PET resin, PC resin, PVC resin, or the like, but the disclosure is not limited thereto.

The bottom cover 430 may accommodate the light guide plate 410, the light emitting module unit 440, the reflective member 420, and the like. For this, the bottom cover 430 may have a box shape with an open upper surface, but the disclosure is not limited thereto. The bottom cover 430 may be formed of a metal or a resin and manufactured by a method such as press molding, extrusion molding, or the like.

Embodiments provide a semiconductor device in which a pinhole is not formed in an initial buffer layer and a method of manufacturing the same. In one embodiment, a semiconductor device includes a silicon substrate, an initial buffer layer disposed on the silicon substrate and including aluminum nitride (AlN), and a device layer disposed on the initial buffer layer and including a semiconductor compound, wherein there is no SiN between the initial buffer layer and the silicon substrate, and a silicon lattice of the silicon substrate directly contacts a lattice of the initial buffer layer.

The initial buffer layer may have a (002) crystal plane as a main plane. The initial buffer layer may have a full width at half maximum (FWHM) of 600 arcsec to 1000 arcsec. A roughness of the initial buffer layer may have a root mean square of 0.1 nm to 0.3 nm. The initial buffer layer may have a thickness of 50 nm to 300 nm.

The semiconductor device may further include a transition layer disposed between the initial buffer layer and the device layer. The transition layer may include a plurality of AlN/$Al_xGa_{1-x}N$ superlattice unit layers. X values in the AlN/$Al_xGa_{1-x}N$ superlattice unit layers may gradually decrease with increasing distance from the initial buffer layer.

The semiconductor device may further include at least one intermediate layer disposed between the transition layer and the device layer. The intermediate layer may include a first intermediate layer and a second intermediate layer disposed between the first intermediate layer and the device layer.

The initial buffer layer may include an ultrathin Al film deposited on the silicon substrate.

In another embodiment, a method of manufacturing a semiconductor device includes forming an initial buffer layer on a silicon substrate and forming a device layer on the initial buffer layer, wherein the forming of the initial buffer layer includes heating the silicon substrate to a first temperature in a chamber, reducing an internal temperature of the chamber to a second temperature that is lower than the first temperature, flowing a first gas including Al in the chamber at the second temperature for a first predetermined period, and flowing a second gas including nitrogen together with the first gas for a second predetermined period at which the internal temperature of the chamber is increased to a third temperature that is higher than the second temperature, after the first predetermined period elapses.

The method may further include, after the internal temperature of the chamber is reduced to the second temperature and before the first gas is flowed, maintaining the internal temperature of the chamber at the second temperature.

The first predetermined period may be 5 seconds to 15 seconds.

A difference between the second temperature and the third temperature may be 200° C. to 300° C. The second temperature may be 750° C. to 850° C. A supply ratio of the first gas to the second gas may be 1:100 to 1:1500. A constant amount of hydrogen may be supplied during the forming of the initial buffer layer. A period for the maintaining of the internal temperature may be 0 minutes to 5 minutes. A flow amount of the first gas may be larger at the second predetermined period than at the first predetermined period.

As is apparent from the above description, in semiconductor devices according to embodiments and methods of manufacturing the same, a first gas including Al is pre-flowed at a temperature of 750° C. to 850° C. that is lower than 1050° C. to 1150° C. and then a second gas including nitrogen is flowed together with the first gas at a temperature of 1000° C. to 1100° C. that is higher than 750° C. to 850° C., and thus, formation of a large number of deep and big pinholes in an initial buffer layer formed of AlN may be prevented. Accordingly, silicon nitride (SiN) is not formed between the initial buffer layer and a silicon substrate and surface morphology and crystallinity may also be enhanced.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor device, comprising:
a silicon substrate;
an initial buffer layer provided on the silicon substrate and including aluminum nitride (AlN);
a semiconductor device layer provided on the initial buffer layer and having a semiconductor compound, and
a transition layer provided between the initial buffer layer and the semiconductor device layer, wherein the initial buffer layer includes an ultrathin Al film deposited on the silicon substrate, and a silicon lattice of the silicon substrate directly contacts a lattice of the initial buffer layer, and wherein the transition layer includes a plurality of AlN/Al$_x$Ga$_{1-x}$N superlattice unit layers.

2. The semiconductor device according to claim 1, wherein the initial buffer layer has a crystal plane as a main plane.

3. The semiconductor device according to claim 2, wherein the initial buffer layer has a full width at half maximum (FWHM) of 600 arcsec to 1000 arcsec.

4. The semiconductor device according to claim 1, wherein a roughness of the initial buffer layer has a root mean square of 0.1 nm to 0.3 nm.

5. The semiconductor device according to claim 1, wherein the initial buffer layer has a thickness of 50 nm to 300 nm.

6. The semiconductor device according to claim 1, wherein x values in the AlN/Al$_x$Ga$_{1-x}$N superlattice unit layers gradually decrease with increasing distance from the initial buffer layer.

7. The semiconductor device according to claim 1, further including at least one intermediate layer provided between the transition layer and the semiconductor device layer.

8. The semiconductor device according to claim 7, wherein the intermediate layer includes:
a first intermediate layer; and
a second intermediate layer provided between the first intermediate layer and the semiconductor device layer.

9. The semiconductor device according to claim 1, wherein an AlN layer on the Al film and the silicon lattice of the silicon substrate directly contacts a lattice of the Al film of initial buffer layer.

10. A method of manufacturing a semiconductor device, the method comprising:
forming an initial buffer layer on a silicon substrate; and
forming a semiconductor device layer on the initial buffer layer, wherein the forming of the initial buffer layer includes:
heating the silicon substrate to a first temperature in a chamber;
reducing an internal temperature of the chamber to a second temperature, the second temperature being lower than the first temperature and the second temperature is 750° C. to 850° C.;
forming an ultrathin Al film on the silicon substrate by flowing a first gas including Al in the chamber at the second temperature for a first predetermined period; and
flowing a second gas including nitrogen together with the first gas for a second predetermined period at which the internal temperature of the chamber is increased to a third temperature that is higher than the second temperature, after the first predetermined period elapses.

11. The method according to claim 10, further including, after the internal temperature of the chamber is reduced to the second temperature and before the first gas is flowed, maintaining the internal temperature of the chamber at the second temperature.

12. The method according to claim 10, wherein the first predetermined period is 5 seconds to 15 seconds.

13. The method according to claim 10, wherein a difference between the second temperature and the third temperature is 200° C. to 300° C.

14. The method according to claim 10, wherein a supply ratio of the first gas to the second gas is 1:100 to 1:1500.

15. The method according to claim 10, wherein a constant amount of hydrogen is supplied during the forming of the initial buffer layer.

16. A semiconductor device manufactured according to claim 10, including:
one selected from group of a power device, a light emitting device, and a sensor,
wherein the power device includes one selected from a group of a high electron mobility transistor (HEMT), a heterostructure field effect transistor (HFET), a double HFET, a gated bipolar junction transistor, a gated hot electron transistor, a gated heterostructure bipolar junction transistor, a power switching transistor, and a microwave transistor,
wherein the light emitting device includes a lighting device, and
wherein the sensor includes one selected from group of a photodetector, a gas sensor, a liquid sensor, a pressure sensor, and a multi-function sensor having pressure and temperature sensor functions.

* * * * *